United States Patent
Teng

(10) Patent No.: US 6,902,865 B2
(45) Date of Patent: Jun. 7, 2005

(54) NON-ALKALINE AQUEOUS DEVELOPMENT OF THERMOSENSITIVE LITHOGRAPHIC PRINTING PLATES

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 144 days.

(21) Appl. No.: 10/200,279

(22) Filed: Jul. 22, 2002

(65) Prior Publication Data

US 2004/0013968 A1 Jan. 22, 2004

(51) Int. Cl.[7] .............................................. G03F 7/038
(52) U.S. Cl. .................... 430/302; 430/944; 430/270.1; 430/271.1; 430/273.1
(58) Field of Search .................................. 430/302, 944

(56) References Cited

U.S. PATENT DOCUMENTS

| | | | | |
|---|---|---|---|---|
| 3,891,439 A | * | 6/1975 | Katz et al. ................... | 430/331 |
| 4,997,745 A | | 3/1991 | Kawamura et al. .......... | 430/281 |
| 5,035,982 A | * | 7/1991 | Walls .......................... | 430/331 |
| 5,491,046 A | | 2/1996 | DeBoer et al. .............. | 430/302 |
| 5,607,816 A | * | 3/1997 | Fitzgerald et al. ........ | 430/271.1 |
| 5,674,658 A | | 10/1997 | Burbery et al. ............. | 430/262 |
| 5,677,106 A | | 10/1997 | Burbery et al. ............. | 430/253 |
| 5,807,659 A | | 9/1998 | Nishimiya et al. .......... | 430/302 |
| 6,014,929 A | | 1/2000 | Teng ........................... | 101/456 |
| 6,117,610 A | | 9/2000 | Sheriff et al. ............... | 430/190 |
| 6,153,356 A | | 11/2000 | Urano et al. ............. | 430/281.1 |
| 6,165,676 A | | 12/2000 | Hattori .................... | 430/270.1 |
| 6,232,038 B1 | | 5/2001 | Takasaki et al. ......... | 430/281.1 |
| 6,242,156 B1 | | 6/2001 | Teng ........................ | 430/271.1 |
| 6,383,717 B1 | * | 5/2002 | Fiebag et al. ............... | 430/302 |
| 2002/0086238 A1 | * | 7/2002 | Fujimaki et al. .......... | 430/281.1 |
| 2002/0177071 A1 | * | 11/2002 | Okamoto .................... | 430/302 |

FOREIGN PATENT DOCUMENTS

| | | | |
|---|---|---|---|
| EP | 1136255-a2 | * 9/2001 | |
| JP | 2001-175006 A | * 6/2001 | |
| WO | wo 02/31599 a2 | * 4/2002 | ............. G03F/7/32 |

OTHER PUBLICATIONS machine translation from PAJ (Publication No. 2001–175006 and Engllish Abstract from Patent Abstracts of Japan of Fuji Photo.*

DOWANOL Eph, DOW, Glycol Ether Products, Global Product Information, Copyright 2004, three pages, obtained from the world wide web.*

DOWANOL PM, DOW, Glycol Ether Products, Global Product Information, Copyright 2004, three pages, obtained from the world wide web.*

FUJIFILM Material Safety Data Sheet, Finished Good Catalog, 819470 CA–1 Color Art Developer (3X2L), Fuji Photo Film USA Inc, Revision date Jul. 23, 1998, 5 pages.*

FUJIFILM Material Safety Data Sheet, Finished Good Catalog, 55110002 CA–1 Color Art Developer (3X2L), Fuji Photo Film USA, Inc, Revision date Apr. 4, 2003, 6 pages.*

* cited by examiner

*Primary Examiner*—Cynthia Hamilton

(57) ABSTRACT

Negative thermosensitive lithographic printing plates developable with a non-alkaline aqueous developer and method of developing such plates. The plate comprises on a substrate a thermosensitive layer comprising an ethylenically unsaturated monomer, a free radical initiator, and an infrared absorbing dye. The plate can be imagewise exposed with an infrared laser to cause hardening in the exposed areas and then developed with a non-alkaline aqueous developer to remove the non-exposed areas. The non-alkaline aqueous developer can be water or an aqueous solution comprising at least 60% of water and having a pH of 2.0 to 10.0.

12 Claims, No Drawings

NON-ALKALINE AQUEOUS DEVELOPMENT OF THERMOSENSITIVE LITHOGRAPHIC PRINTING PLATES

FIELD OF THE INVENTION

This invention relates to lithographic printing plates. More particularly, it relates to negative thermosensitive lithographic plates developable with a non-alkaline aqueous developer and method of developing such plates.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties (such as hydrophilic vs. oleophilic, and oleophobic vs. oleophilic). The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate.

Traditionally the plate is exposed with an actinic light (usually an ultraviolet light from a lamp) through a separate photomask having predetermined image pattern that is placed between the light source and the plate. Laser sources have been increasingly used to imagewise expose a printing plate that is sensitized to a corresponding laser, allowing the elimination of photomask, reducing material, equipment and labor cost.

Among the laser imagable plates, infrared laser sensitive plates, also called thermosensitive plates or thermal plates, are most attractive because they often can be handled and processed under white light.

U.S. Pat. No. 5,491,046 describes a lithographic plate having on a substrate a thermosensitive layer comprising a resole resin, a novolac resin, a haloalkyl substituted s-triazine, and an infrared absorber. U.S. Pat. No. 6,117,610 describes a lithographic plate having on a substrate an infrared imaging composition comprising a non-basic infrared radiation absorbing material and a phenolic resin that is either mixed or reacted with an o-diazonaphthoquinone derivative. These plates can be imagewise exposed with an infrared laser and then developed with an aqueous alkaline developer to form positive imaging.

U.S. Pat. No. 6,153,356 describes a lithographic plate having on a substrate a photopolymerizable composition comprising an ethylenically unsaturated compound, a cyanine dye, and a photopolymerization initiator. U.S. Pat. No. 6,232,038 describes a lithographic plate having on a substrate a photosensitive composition comprising an ethylenically unsaturated double bond-containing compound, a sensitizing dye, and a photopolymerization initiator. These plates can be imagewise exposed with an infrared laser to cause hardening in the exposed areas and then developed with an aqueous alkaline developer to form negative imaging.

While the plates developed with aqueous alkaline developer are capable of superior lithographic quality, the use of aqueous alkaline developer has two major drawbacks. First, the alkaline developer is caustic liquid that is a health hazard and requires special handling. Second, alkaline developer is very hard to maintain for the target alkaline strength in the plate processor due to the constant reaction of the alkaline compound with carbon dioxide from the air.

Thermosensitive lithographic plates not requiring an alkaline developer have been proposed in the literature. For example, U.S. Pat. Nos. 5,674,658 and 5,677,106 describe lithographic plates comprising on a porous hydrophilic substrate an oleophilic radiation-absorbing heat-sensitive layer that is capable of bonding to the porous substrate through thermal flow upon exposure to an infrared laser. The non-exposed areas can be removed by contacting with ink or by lamination and peel development step. While such plates do not require alkaline developer, they suffer from poor press durability.

Therefore, there is a desire for a thermosensitive plate that does not require an alkaline developer and has excellent press performance, and a method of developing such a plate.

SUMMARY OF THE INVENTION

It is an object of this invention to provide a thermosensitive lithographic plate which is imagable with an infrared laser and developable with a non-alkaline developer.

It is another object of this invention to provide a non-alkaline aqueous developable thermosensitive lithographic plate having on a substrate a thermosensitive layer comprising a polymerizable monomer, an initiator, and an infrared absorbing dye.

It is another object of this invention to provide a method of developing a plate using a non-alkaline aqueous developer.

Further objects, features and advantages of the present invention will become apparent from the detailed description of the preferred embodiments.

According to the present invention, there has been provided a method of processing a lithographic printing plate, comprising:

(a) providing a lithographic plate comprising on a hydrophilic substrate an oleophilic thermosensitive layer comprising a free radical polymerizable ethylenically unsaturated monomer, a free-radical initiator, and an infrared absorbing dye, wherein said thermosensitive layer is capable of hardening upon exposure to an infrared laser and developable with a non-alkaline aqueous developer having a pH of 2.0 to 10.0;

(b) imagewise exposing the plate with said infrared laser to cause hardening of the thermosensitive layer in the exposed areas; and (c) developing the exposed plate with said aqueous developer to remove the non-hardened areas of the thermosensitive layer.

The non-alkaline aqueous developer can be water or any aqueous solution comprising at least 60% of water and having a pH of 2.0 to 10.0. Water-soluble solvent, surfactant, and/or other additives can be added.

The developability of the plate with a non-alkaline aqueous developer can be improved by using releasable interlayer, having higher monomer-to-polymer ratio, adding nonionic surfactant in the thermosensitive layer, and utilizing semisolid thermosensitive layer and conformal coating configuration.

DETAILED DESCRIPTION OF THE PREFERRED EMBODIMENTS

The support employed in the lithographic plates of this invention can be any support that provides a hydrophilic surface. Such a support may be a metal sheet, a polymer film, or a coated paper. Aluminum (including aluminum alloys) sheet is a preferred support. Particularly preferred is an aluminum support that has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic printing plate application are well known in the art, and examples can be found in U.S. Pat. Nos. 2,714,066, 4,153,461, 4,399,021, and 5,368,974.

The thermosensitive layer suitable for preparing printing plates of the current invention comprises a free radical polymerizable ethylenically unsaturated monomer, a free-radical initiator, and an infrared absorbing dye, is capable of hardening upon exposure to an infrared laser (about 700 to 1500 nm in wavelength), and is developable with a non-alkaline aqueous developer. Polymeric binder (with or without ethylenic groups) and various additives, such as pigment, dye, surfactant, plasticizer, exposure indicator, and stabilizer, can be added. Here, non-alkaline aqueous developer is defined as an aqueous developer comprising at least 60% by weight of water and having a pH of 2.0 to 10.0. The non-alkaline aqueous developer can be water or an aqueous solution. The term being developable means being capable of being removed upon contact with the developer with or without brushing or other mechanical action. Here hardening means becoming non-developable with the developer, and is achieved through polymerization of the monomer, as well as the polymer with ethylenic groups. The thermosensitive layer preferably has a coverage of from 100 to 4000 mg/m$^2$, and more preferably from 400 to 2000 mg/m$^2$.

The term thermosensitive layer is defined as a radiation-sensitive layer capable of hardening upon exposure to an infrared radiation, irrespective of the mechanism. The infrared absorbing dye may act as a sensitizer or light-to-heat converter in the thermosensitive layer to activate the free radical initiator. The term monomer includes both monomer and oligomer. The term (meth)acrylate includes both acrylate and methacrylate.

The thermosensitive layer can be a single layer with substantially homogeneous composition along the depth. However, the thermosensitive layer can consist of more than one sublayers having different compositions (such as different resins) or different material ratios in each layer (such as higher infrared dye amount in the inner layer than the top layer). The thermosensitive layer may also have composition gradient along the depth (such as lower infrared dye amount toward the surface and higher infrared dye amount toward the substrate).

In a preferred embodiment as for negative-working lithographic printing plates of this invention, the thermosensitive layer comprises at least one polymerizable ethylenically unsaturated monomer having at least one terminal ethylenic group, at least one free-radical initiator capable of generating free radical in the presence of an infrared absorbing dye upon exposure to an infrared radiation, and at least one infrared absorbing dye, optionally with one or more polymeric binders with or without ethylenic groups. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. It is noted that certain additives can significantly reduce the polymerization rate of a free radical polymerization system sensitized by an infrared absorbing dye and should be avoided or used at minimum. For thermosensitive layer with addition of polymeric binder, the monomer-to-polymer weight ratio is preferably larger than 1.0, more preferably larger than 1.5, and most preferably larger than 2.0. Higher monomer-to-polymer weight ratio generally allows better developability with non-alkaline aqueous developer.

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Any free radical initiator capable of generating free radical in the presence of an infrared absorbing dye upon exposure to an infrared radiation can be used as the thermosensitive free radical initiator of this invention. Suitable free-radical initiators include, for example, the derivatives of acetophenone (such as 2,2-dimethoxy-2-phenylacetophenone, and 2-methyl-1-[4-(methylthio) phenyl]-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4- ethoxyethylenoxy)-phen-1-yl]-s-triazine, and s-triazines as described in U.S. Pat. Nos. 5,955,238, 6,037,098, 6,010,824, and 5,629,354); and titanocene (bis($\eta^9$-2,4-cyclopentadien-1-yl) bis[2,6-difluoro-3-(1H-pyrrol-1-yl)phenyl] titanium). Onium salts, borate salts, and s-triazines are preferred thermosensitive free radical initiators. Diaryliodonium salts and triarylsulfonium salts are preferred onium salts. Triarylalkylborate salts are preferred borate salts. Trichloromethyl substituted s-triazines are preferred s-triazines.

Infrared absorbing dyes useful in the thermosensitive layer of this invention include any infrared absorbing dye effectively absorbing an infrared radiation having a wavelength of 700 to 1,500 nm. It is preferable that the dye having an absorption maximum between the wavelengths of 750 and 1,200 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared absorbing dye is added in the thermosensitive layer preferably at 0.01 to 20% by weight of the thermosensitive layer, more preferably at 0.05 to 10%, and most preferably at 0.2 to 5%.

While a thermosensitive layer generally comprises an infrared absorbing dye, the infrared dye moiety may also be incorporated into the molecules of the initiator, monomer, oligomer, or polymer. For example, infrared dye moieties are incorporated into the polymer of a thermosensitive layer for a waterless lithographic plate as described in U.S. Pat. No. 6,132,933. Clearly, this polymer can function as both polymeric binder and infrared absorbing dye.

Suitable polymeric binders for the thermosensitive layers of this invention include, for example, polystyrene, (meth) acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, butadiene/acrylonitrile copolymer, and polyurethane binder. Also useful are aqueous alkaline soluble polymers, such as (meth)acrylic polymer with substantial number of carboxylic acid functional groups, polymer with substantial number of phenol groups, and polymer with (meth)acrylate groups and carboxylate salt groups as described in U.S. Pat. No. 5,849,462. An aqueous alkaline-soluble polymer is defined as a polymer that is soluble in an organic solvent-free alkaline aqueous solution with a pH of above 12.0. Preferred polymeric binders are aqueous alkaline-insoluble oleophilic polymers. The polymers described in this invention may or may not have ethylenic groups.

Various surfactants may be added into the thermosensitive layer to allow or enhance the developability with water or other non-alkaline aqueous developer. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the thermosensitive layer, more preferably from 0.5 to 20%, and most preferably from 1 to 15%.

The thermosensitive layer may be conformably coated onto a roughened substrate (for example, with Ra of larger than 0.4 micrometers) at thin coverage (for example, of less than 1.5 g/m$^2$) so that the plate can have microscopic peaks and valleys on the thermosensitive layer coated surface and exhibit low tackiness and good block resistance, as described in U.S. Pat. No. 6,242,156, the entire disclosure of which is hereby incorporated by reference. Here the substrate has a roughened surface comprising peaks and valleys, and the thermosensitive layer is substantially conformally coated on the roughened substrate surface so that the surface of the thermosensitive layer has peaks and valleys substantially corresponding to the major peaks and valleys of the substrate microscopic surface. In a preferred embodiment, the substrate has an average surface roughness Ra of about 0.2 to about 2.0 microns, the thermosensitive layer has an average coverage of about 0.1 to about 2.0 g/m$^2$, and the average height of the valleys on the thermosensitive layer surface is at least 0.1 microns below the average height of the peaks on the thermosensitive layer surface. Such a configuration is especially useful for a plate with a semisolid thermosensitive layer because it allows reduction or elimination of the tackiness and fingerprinting problems. Semisolid thermosensitive layer is particularly useful in this invention because it generally has better developability with non-alkaline aqueous developer than solid thermosensitive layer.

Water soluble or dispersible overcoat may be deposited on top of the thermosensitive layer to, for example, protect the thermosensitive layer from oxygen inhibition, contamination, and/or physical damage during handling, and reduce tackiness and blocking tendency. The overcoat preferably comprises a water-soluble polymer, such as polyvinyl alcohol (including various water-soluble derivatives of polyvinyl alcohol). Various additives, such as surfactant, wetting agent, defoamer, leveling agent, and dispersing agent, can be added into the overcoat formulation to facilitate, for example, the coating or development process. Various nonionic surfactants and ionic surfactants can be used. Examples of surfactants useful in the overcoat of this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added preferably at 0.01 to 40% by weight of the overcoat, more preferably at 0.2 to 15%. The overcoat preferably has a coverage of from 0.02 to 6 g/m$^2$, more preferably from 0.2 to 3 g/m$^2$.

For plates with rough and/or porous surface capable of mechanical interlocking with a coating deposited thereon, a thin releasable interlayer soluble or dispersible in the developer suitable for the thermosensitive layer may be deposited between the substrate and the thermosensitive layer. Here the substrate surface is rough and/or porous enough and the interlayer is thin enough to allow bonding between the thermosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. Such a releasable interlayer can help improve the developability of the plate with a non-alkaline aqueous developer, reduce or eliminate cross-contamination between the thermosensitive layer and the substrate, improve the photospeed and curing efficiency, improve shelf life stability, and/or reduce background toning or scumming. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to about 2.0 microns, and more preferably 0.4 to 1.0 microns.

The non-alkaline aqueous developer can be water or an aqueous solution comprising at least 60% by weight of water and having a pH of 2.0 to 10.0. One or more water-soluble organic solvents can be added to, for example, improve the developability. The organic solvent must be soluble in water at the added concentration. Water-soluble liquid organic compounds having at least one hydroxyl group are preferred organic solvents; such compounds are called alcohol solvents in this patent. Liquid alkyl alcohol and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The organic solvent or the alcohol solvent can be added preferably at 0.5 to 40% by weight of the developer, more preferably 1 to 30%, and most preferably at 2 to 20%.

Various surfactants can be added into the developer to, for example, help the wetting of the developer on the plate, improve the developability, reduce solid residue in the developer, and condition the bared substrate. Either ionic or nonionic water-soluble surfactant or both can be used. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, and ammonium laurylsulfate. The surfactant is preferably added at from 0.01 to 20% by weight of the developer, more preferably from 0.1 to 10%, and most preferably 0.5 to 5%. Various other additives, such as defoamer, bactericide, dye, and substrate conditioner (such as gum arabic, and maltodextrin), can be added. Certain salts, such as sodium butylnaphthalenesulfate, sodium chloride, and ammonium sulfite, potassium phosphate, sodium cumenesulfonate, may be added to, for example, improve the hydrophilicity of the bared substrate.

The non-alkaline aqueous developer should have a pH of 2.0 to 10.0, preferably 4.0 to 9.0, more preferably 6.0 to 8.0. Unlike conventional alkaline developer which has higher concentration of strong base (such as 5–10% sodium silicate or potassium silicate) and a pH of above 12.0, the instant developer is neutral or slightly to moderately basic or acidic. While a pH of close to neutral (pH of about 7.0) is preferred, the pH may be slightly to moderately basic or acidic due to addition of certain additives for improving, for example, the hydrophilicity of the bared substrate. For example, phosphoric acid or citric acid may be added to improve the hydrophilicity of certain substrate; and small amount of diethanolamine may be added to adjust the pH to slightly basic to improve the hydrophilicity of certain substrate.

The exposed plate can be developed with a non-alkaline developer through various methods, such as hand development, machine development, and even on-press development, to remove the non-imaged areas. By hand development, the developer is usually poured onto the plate and the plate is wiped or rubbed with a cloth soaked with the developer; a hand brush may be used. By machine development, the plate is usually passed through a developer section, rinse section, optionally gumming, and drying section of the machine; brushing rollers are usually installed in the developer section to help remove the non-exposed areas. For plate developable with water or fountain solution, the development may be carried out with the plate being mounted on the plate cylinder of a press; the plate may be imaged before mounting on press or while mounted on press. For plate developable with water, the plate may be directly flushed with regular or warm tap water, or may be developed on a regular developing machine using regular or warm water as the developer. While the above are some typical development processes, various other methods can be used to develop the plate using a non-alkaline aqueous developer.

The non-hardened areas of the thermosensitive layer can be removed by the non-alkaline aqueous developer through any mechanism and process. There is no limitation on the mechanism and method of development. The thermosensitive layer may be soluble or dispersible in the developer, and dissolved or dispersed in the developer. Alternatively, the thermosensitive layer may be softened by the developer and can be washed away with the developer, with or without brushing or other mechanical action. Further, the developer may penetrate onto the substrate surface in the non-hardened areas and cause peeling of the thermosensitive layer in the non-hardened areas, with or without brushing or other mechanical action. More than one of the above described mechanisms and possibly other mechanisms may take plate in the same development process. For plate with overcoat and/or interlayer, the overcoat and/or interlayer are removed by dissolution or dispersion, while the thermosensitive layer may be removed by any one or more of the above described mechanisms.

The developed plate is usually directly used for lithographic printing. However, optionally, the developed plate can be further baked at elevated temperature for a certain time, such as 100 to 250° C. for 1 to 10 min, or overall exposed with a radiation, such as an ultraviolet radiation (for plate sensitive to ultraviolet light) or infrared radiation, to allow further curing and longer run length.

The infrared radiation suitable for exposing the lithographic plate of the instant invention can be from any infrared radiation source suitable for digital imaging. Infrared lasers are preferred infrared radiation sources. Infrared lasers useful for the imagewise exposure of the thermosensitive plates of this invention include laser sources emitting in the near infrared region, i.e. emitting in the wavelength range of from 700 to 1500 nm, and preferably from 750 to 1200 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 2000 $mJ/cm^2$, more preferably from 5 to 1000 $mJ/cm^2$, most preferably from 30 to 500 $mJ/cm^2$, depending on the sensitivity of the thermosensitive layer.

Laser imaging devices are currently widely available commercially. Any device can be used which provides imagewise laser exposure according to digital imaging information. Commonly used imaging devices include flatbed imager, internal drum imager, and external drum imager. Internal drum imager and external drum imager are preferred imaging devices.

This invention is further illustrated by the following non-limiting examples of its practice. Unless specified, all the values are by weight.

EXAMPLE 1

An electrochemically grained and anodized aluminum substrate (with an Ra of about 0.5 microns) was coated using a #6 Meyer rod with a thermosensitive layer formulation TS-1, followed by drying in an oven at 80° C. for 2 min.

| TS-1 | |
| --- | --- |
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.00 |
| ADS-830AT (Infrared absorbing cyanine dye from American Dye Source) | 0.20 |
| Acetone | 90.2 |

The thermosensitive layer coated substrate was further coated with a water-soluble overcoat OC-1 using a #6 Meyer rod, followed by hot air blow drying and then oven drying at 80° C. for 2 min.

| OC-1 | |
| --- | --- |
| Component | Weight ratios |
| Airvol 203 (Polyvinyl alcohol from Air Products) | 10.00 |
| Silwet 7604 | 0.10 |
| Water | 90.00 |

The above plate was exposed with an infrared laser plate imager equipped with laser diodes emitting at about 830 nm (Trendsetter from Creo) for a negative imaging pattern at about 150 $mJ/cm^2$. The exposed areas showed brown imaging pattern.

The plate was hand developed by wiping with a cloth soaked with Viking Negative Developer containing estimated about 5% benzyl alcohol in water. The non-exposed areas were gradually removed, and the exposed areas stayed. The plate was further sprayed with fountain solution and rubbed with a cloth dampened with both fountain solution and ink. The plate showed well inked imaging areas and clean background areas.

EXAMPLE 2

In this example, the plate is the same as in EXAMPLE 1 except that a thin releasable interlayer is interposed between the substrate and the thermosensitive layer.

An electrochemically roughened and anodized aluminum sheet was first coated with a 0.2% aqueous solution of polyvinyl alcohol (Airvol 540, from Air Products) with a #6 Meyer rod, followed by hot air blow drying and oven drying at 80° C. for 2 min. The polyvinyl alcohol coated substrate was further coated with the thermosensitive layer and the overcoat with the same procedures as in EXAMPLE 1.

The plate was exposed, developed, and inked as in EXAMPLE 1. The plate developed very quickly. The inked plate showed well inked imaging areas and clean background areas.

EXAMPLE 3

An electrochemically grained and anodized aluminum substrate was coated using a #8 Meyer rod with a thermosensitive layer formulation TS-2, followed by drying in an oven at 80° C. for 2 min.

| TS-2 | |
| --- | --- |
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| (4-(2-Hydroxytetradecyl-oxy)-phenyl)phenyliodonium hexafluoroantimonate | 1.50 |
| PINA FK-1026 (Infrared absorbing polymethine dye from Allied Signal) | 0.10 |
| Acetone | 90.2 |

The above plate was exposed with an infrared laser plate imager equipped with laser diodes emitting at about 830 nm (Pearlsetter from Presstek) for a test pattern at about 600 $mJ/cm^2$. The exposed areas showed brown imaging pattern.

The plate was hand developed by wiping with a cloth soaked with 20% isopropanol. The non-exposed areas were removed, and the exposed areas stayed. The plate was further sprayed with fountain solution and rubbed with a cloth dampened with both fountain solution and ink. The plate showed well inked imaging areas and clean background areas.

EXAMPLE 4

An electrochemically roughened, anodized, and silicated aluminum sheet (with an Ra of about 0.6 microns) was first coated with a 0.1% aqueous solution of polyvinyl alcohol (Airvol 540, from Air Products) with a #6 Meyer rod, followed by hot air blow drying and oven drying at 80° C. for 2 min. The polyvinyl alcohol coated substrate was further coated with the thermosensitive layer formulation TS-3 with a #6 Meyer rod, followed by drying in an oven at 80° C. for 2 min.

| TS-3 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| Cyracure 6974 (Mixed triarylsulfonium hexafluoroantimonate from Union Carbide) | 1.00 |
| PINA FK-1026 (Infrared absorbing polymethine dye from Allied Signal) | 0.20 |
| Acetone | 90.2 |

The thermosensitive layer coated plate was further coated with a water-soluble overcoat OC-2 using a #6 Meyer rod, followed by drying in an oven at 80° C. for 5 min.

| OC-2 | |
|---|---|
| Component | Weight ratios |
| Airvol 205 (Polyvinyl alcohol from Air Products) | 2.00 |
| Dioctyl sulfosuccinate sodium salt (surfactant) | 0.08 |
| Water | 98.0 |

The plate was exposed with an infrared laser plate imager equipped with laser diodes emitting at about 830 nm (Pearlsetter from Presstek) for a negative imaging pattern at about 350 mJ/cm$^2$.

The exposed plate was developed by flushing with regular tap water and rubbing with a cloth, and the non-exposed areas were gradually removed. The plate was rubbed with a cloth dampened with both fountain solution and ink, and showed well inked imaging areas and clean background areas.

A second set of the same plate was exposed as above and developed with warm water by flushing with warm tap water at about 50° C. and rubbing with a cloth, and the non-exposed areas were quickly removed. The plate was rubbed with a cloth dampened with both fountain solution and ink, and showed well inked imaging areas and clean background areas.

EXAMPLE 5

An electrochemically roughened, anodized, and polyvinylphosphonic acid treated aluminum sheet was first coated with a 0.1% aqueous solution of polyvinyl alcohol with a #6 Meyer rod, followed by hot air blow drying and oven drying at 80° C. for 2 min. The polyvinyl alcohol coated substrate was further coated with the thermosensitive layer formulation TS-4 with a #6 Meyer rod, followed by drying in an oven at 80° C. for 5 min.

| TS-4 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-1 using a #6 Meyer rod, followed by hot air blow drying and oven drying at 80° C. for 2 min.

The plate was exposed with an infrared laser plate imager equipped with laser diodes emitting at about 830 nm (Trendetter from Creo) for a test pattern at about 350 mJ/cm$^2$.

The plate was developed by wiping with a cloth soaked with an aqueous developer solution containing 2% benzyl alcohol in water. The non-exposed areas were removed, and the exposed areas stayed. The plate was further rubbed with a cloth dampened with both fountain solution and ink, and showed well inked imaging areas and clean background areas.

EXAMPLE 6

An electrochemically roughened, anodized, and silicated aluminum sheet was first coated with a 0.1% aqueous solution of polyvinyl alcohol with a #6 Meyer rod, followed by hot air blow drying and oven drying at 80° C. for 2 min. The polyvinyl alcohol coated substrate was further coated with the thermosensitive layer formulation TS-5 with a #6 Meyer rod, followed by drying in an oven at 80° C. for 2 min.

| TS-5 | |
|---|---|
| Component | Weight ratios |
| Neocryl B-728 (Polymer from Zeneca) | 2.754 |
| Sartomer SR-399 (Acrylic monomer from Sartomer) | 3.291 |
| Ebecryl 8301 (Urethanated acrylic monomer from UCB Chemicals) | 3.291 |
| Pluronic L43 (Nonionic surfactant from BASF) | 0.560 |
| (4-(2-Hydroxytetradecyl-oxy)-phenyl)phenyliodonium hexafluoroantimonate | 1.981 |
| PINA FK-1151 (Infrared absorbing polymethine dye from Allied Signal) | 0.121 |
| Acetone | 88.000 |

The thermosensitive layer coated plate was further coated with a water-soluble overcoat OC-3 using a #8 Meyer rod, followed by hot air blow drying and oven drying at 80° C. for 5 min.

| OC-3 | |
|---|---|
| Component | Weight ratios |
| Airvol 203 (Polyvinyl alcohol from Air Products) | 15.0 |
| Triton X-100 (Surfactant from Union Carbide) | 0.20 |
| Water | 85.0 |

The plate was exposed with an infrared laser plate imager equipped with laser diodes emitting at about 830 nm (Trendsetter from Creo) for a negative imaging pattern at about 200 mJ/cm$^2$.

The plate was developed by wiping with a cloth soaked with Viking Negative Developer containing estimated about 5% benzyl alcohol in water. The non-exposed areas were quickly removed, and the exposed areas stayed. The plate was further rubbed with a cloth dampened with both fountain solution and ink. The inked plate showed well inked imaging areas and clean background areas.

EXAMPLE 7

An electrochemically roughened and anodized aluminum sheet was coated with the thermosensitive layer formulation TS-6 with a #6 Meyer rod, followed by drying in an oven at 80° C. for 2 min.

TS-6

| Component | Weight ratios |
|---|---|
| Neocryl B-728 (Polymer from Zeneca) | 3.168 |
| Ebecryl 8301 (Urethanated acrylic monomer from UCB Chemicals) | 6.432 |
| (4-(2-Hydroxytetradecyl-oxy)-phenyl)phenyliodonium hexafluoroantimonate | 2.037 |
| PINA FK-1151 (Infrared absorbing polymethine dye from Allied Signal) | 0.125 |
| Orasol Blue GN (Blue dye from Ciba-Geigy) | 0.238 |
| Acetone | 88.000 |

The thermosensitive layer coated plate was further coated with a water-soluble overcoat OC-3 using a #8 Meyer rod, followed by hot air blow drying and oven drying at 80° C. for 2 min.

The plate was exposed and developed as in EXAMPLE 6. The developed plate was tested on a lithographic press (AB Dick 360) equipped with integrated inking/dampening system. The printed sheets showed good inking, clean background, and good resolution. The plate continued to run for a total of 10,000 impressions without showing any wearing (The press stopped at 10,000 impressions.).

I claim:

1. A method of processing a lithographic printing plate, comprising in order:
   (a) providing a lithographic plate comprising (i) a hydrophilic substrate; and (ii) an oleophilic thermosensitive layer comprising an aqueous alkaline-insoluble polymer, a (meth)acrylate monomer, a free-radical initiator, and an infrared absorbing dye; wherein said monomer-to-polymer weight ratio is larger than 1.0, and said thermosensitive layer is capable of hardening upon exposure to an infrared laser and developable with an aqueous developer comprising at least 60–90% by weight of water and 1 to 30% by weight of an alcohol solvent and having a pH of 4.0 to 8.0;
   (b) imagewise exposing the plate with said infrared laser to cause hardening of the thermosensitive layer in the exposed areas; and
   (c) developing the exposed plate with said aqueous developer to remove the non-hardened areas of the thermosensitive layer.

2. The method of claim 1 wherein said alcohol is selected from the group consisting of liquid water-soluble alkyl alcohol, arylalkyl alcohol, alkoxyalkyl alcohol, arylalkoxyalkyl alcohol,m aroxyalkyl alcohol, oxydialkanol, and alkyl lactate.

3. The method of claim 1 wherein said aqueous developer further comprises a surfactant at 0.01 to 20% by weight of the developer.

4. The method of claim 1 wherein said monomer-to-polymer weight is larger than 1.5.

5. The method of claim 1 wherein said monomer-to-polymer weight ratio is larger than 2.0.

6. The method of processing a lithographic printing plate, comprising in order:
   (a) providing a lithographic plate comprising (i) a hydrophilic substrate; (ii) an oleophilic thermosensitive layer comprising an aqueous alkaline-insoluble polymer, a (meth)acrylate monomer, a free-radical initiator, and an infrared absorbing dye; and (iii) an water soluble or dispersible overcoat; wherein said monomer-to-polymer weight ratio is larger than 1.5, and said thermosensitive layer is capable of hardening upon exposure to an infrared laser and developable with an aqueous developer comprising at least 60% by weight of water and having a pH of 6.0 to 8.0;
   (b) imagewise exposing the plate with said infrared laser to cause hardening of the thermosensitive layer in the exposed areas; and
   (c) developing the exposed plate with said aqueous developer to remove the non-hardened areas of the thermosensitive layer.

7. The method of claim 6 wherein said aqueous developer comprises an alcohol solvent at 1 to 30% by weight of said developer, said alcohol solvent being a water-soluble organic solvent having at least one hydroxyl group.

8. The method of claim 6 wherein said aqueous developer further comprises a surfactant at 0.1 to 10% by weight of the developer.

9. The method of claim 6 wherein said aqueous developer is tap water, or any purified or unpurified water (without addition of water-soluble organic solvent or surfactant and having a pH of 6.0 to 8.0).

10. The method of claim 6 wherein said water is a warm water having a temperature of 30 to 80° C.

11. The method of claim 6 wherein said plate further includes a water-soluble interlayer interposed between the substrate and the thermosensitive layer, wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the thermosensitive layer and the substrate through mechanical interlocking.

12. The method of claim 1 wherein said aqueous developer has a pH of 6.0 to 8.0.

* * * * *